United States Patent
Yang

(10) Patent No.: US 8,782,329 B2
(45) Date of Patent: Jul. 15, 2014

(54) METHOD FOR PERFORMING DATA SHAPING, AND ASSOCIATED MEMORY DEVICE AND CONTROLLER THEREOF

(75) Inventor: Tsung-Chieh Yang, Hsinchu (TW)

(73) Assignee: Silicon Motion Inc., Jhubei, Hsinchu County (TW)

(*) Notice: Subject to any disclaimer, the term of this patent is extended or adjusted under 35 U.S.C. 154(b) by 634 days.

(21) Appl. No.: 13/009,854

(22) Filed: Jan. 20, 2011

(65) Prior Publication Data

US 2012/0005409 A1 Jan. 5, 2012

(30) Foreign Application Priority Data

Jul. 1, 2010 (TW) .............................. 99121667 A

(51) Int. Cl.
*G06F 12/02* (2006.01)

(52) U.S. Cl.
USPC .................................. 711/103; 711/E12.008

(58) Field of Classification Search
None
See application file for complete search history.

(56) References Cited

U.S. PATENT DOCUMENTS

| | | | | |
|---|---|---|---|---|
| 5,570,307 A | * | 10/1996 | Takahashi | 708/256 |
| 7,158,058 B1 | * | 1/2007 | Yu | 341/58 |
| 8,417,879 B2 | * | 4/2013 | Chen et al. | 711/103 |
| 2003/0233548 A1 | * | 12/2003 | Moreaux et al. | 713/168 |
| 2008/0082825 A1 | | 4/2008 | Mizushima | |
| 2009/0204824 A1 | * | 8/2009 | Lin et al. | 711/103 |
| 2010/0217921 A1 | * | 8/2010 | Mun | 711/103 |
| 2010/0229007 A1 | * | 9/2010 | Park | 711/103 |
| 2012/0144277 A1 | * | 6/2012 | Lee et al. | 714/807 |

* cited by examiner

*Primary Examiner* — Michael Krofcheck
(74) *Attorney, Agent, or Firm* — Winston Hsu; Scott Margo

(57) ABSTRACT

A method for performing data shaping is provided. The method is applied to a controller of a Flash memory, where the Flash memory includes a plurality of blocks. The method includes: according to contents of data to be written into or read from the Flash memory, generating/recovering an input seed of at least one randomizer/derandomizer; and utilizing the randomizer/derandomizer to generate a random function according to the input seed, for use of adjusting a plurality of bits of the data bit by bit. An associated memory device and a controller thereof are also provided.

13 Claims, 12 Drawing Sheets

METHOD FOR PERFORMING DATA SHAPING, AND ASSOCIATED MEMORY DEVICE AND CONTROLLER THEREOF

BACKGROUND OF THE INVENTION

1. Field of the Invention

The present invention relates to access to a Flash memory, and more particularly, to a method for performing data shaping, and to an associated memory device and a controller thereof.

2. Description of the Prior Art

As technologies of Flash memories progress in recent years, many kinds of portable memory devices (e.g. memory cards respectively complying with SD/MMC, CF, MS, and XD standards) or solid state drives (SSDs) equipped with Flash memories are widely implemented in various applications. Therefore, the control of access to Flash memories in these memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of at least two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. In order to ensure that the access control of a memory device over the Flash memory therein can comply with related standards, the controller of the Flash memory should have some handling mechanisms in order to properly handle its data access operations.

According to the related art, the memory device having the aforementioned handling mechanisms may still suffer from some deficiencies. For example, due to usage behaviors of the user, data of some specific data patterns would probably be constantly written into the Flash memory, where these specific data patterns may easily cause errors such as write/program errors, read errors, etc. Although the memory device may be equipped with a randomizer for adjusting data in order to solve such a problem, the data after adjustment is typically not random enough due to the conventional low cost design. In addition, when it is needed to perform an internal data moving operation within the Flash memory, a problem of inability to correctly generate an input seed of the randomizer may occur, causing erroneous data. Therefore, a novel method is required for performing data pattern management regarding data accessed by the controller in order to reduce the probability of error occurrence.

SUMMARY OF THE INVENTION

It is therefore an objective of the claimed invention to provide a method for performing data shaping, and to provide an associated memory device and a controller thereof, in order to solve the above-mentioned problems.

It is another objective of the claimed invention to provide a method for performing data shaping, and to provide an associated memory device and a controller thereof, in order to suppress errors.

It is another objective of the claimed invention to provide a method for performing data shaping, and to provide an associated memory device and a controller thereof, in order to perform an internal data moving operation within a Flash memory without merging an input seed of a randomizer into data being written to the Flash memory.

According to a preferred embodiment of the claimed invention, a method for performing data shaping is provided. The method is applied to a controller of a Flash memory, where the Flash memory comprises a plurality of blocks. The method comprises: according to contents of data to be written into/read from the Flash memory, generating/recovering an input seed of at least one randomizer/derandomizer; and utilizing the randomizer/derandomizer to generate a random function according to the input seed, for use of adjusting a plurality of bits of the data.

While the method mentioned above is disclosed, an associated memory device is further provided. The memory device comprises: a Flash memory comprising a plurality of blocks; and a controller arranged to access the Flash memory and manage the plurality of blocks, and further perform data shaping regarding data accessed by the controller itself. In addition, the controller comprises at least one randomizer/derandomizer arranged to generate a random function according to an input seed, with the random function being utilized for adjusting a plurality of bits of the data when the controller receives a write/read command, wherein the write/read command is utilized for instructing the controller to write the data into/read the data from the Flash memory, Additionally, according to contents of the data, the controller generates/recovers the input seed.

While the method mentioned above is disclosed, a controller of a memory device is further provided, wherein the controller is utilized for accessing a Flash memory comprising a plurality of blocks. The controller comprises: a read only memory (ROM) arranged to store a program code; a microprocessor arranged to execute the program code to control access to the Flash memory and manage the plurality of blocks, wherein under control of the microprocessor, the controller performs data shaping regarding data accessed by the controller itself; and at least one randomizer/derandomizer arranged to generate a random function according to an input seed, with the random function being utilized for adjusting a plurality of bits of the data when the controller receives a write/read command, wherein the write/read command is utilized for instructing the controller to write the data into/read the data from the Flash memory. In addition, according to contents of the data, the controller generates/recovers the input seed.

According to a preferred embodiment of the claimed invention, a method for performing data shaping is provided. The method is applied to a controller of a Flash memory, where the Flash memory comprises a plurality of blocks. The method comprises: receiving a command for accessing data;

utilizing content of the data to generate a seed for shaping the data; generating a shaping sequence according to the seed; and shaping the data bit by bit according to the shaping sequence.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
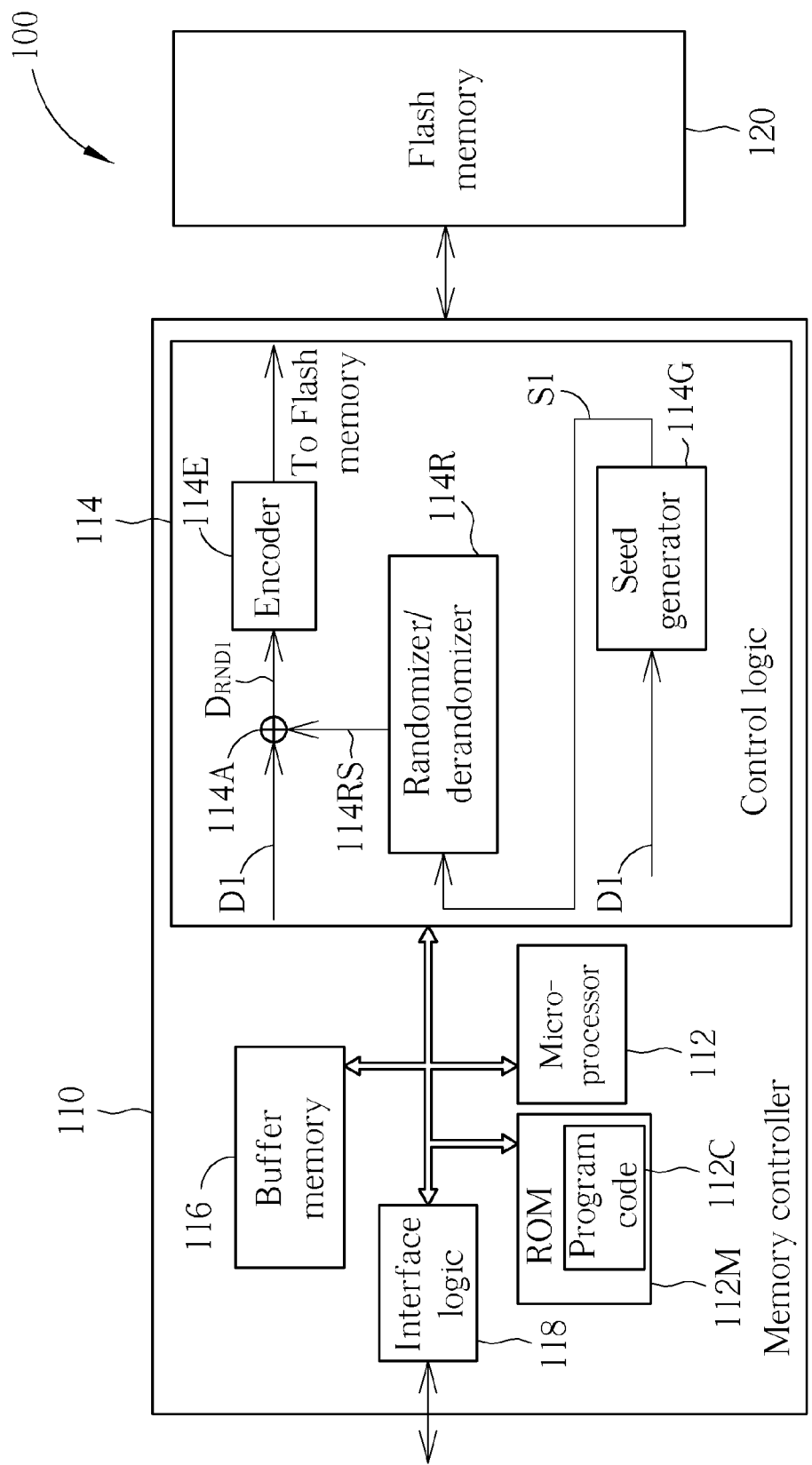
FIG. 1A is a diagram of a memory device according to a first embodiment of the present invention.

Please refer to FIG. 1A, which illustrates a diagram of a memory device 100 according to a first embodiment of the present invention. In particular, the memory device 100 of this embodiment is a portable memory device, examples of which may include, but not limited to, memory cards complying with SD/MMC, CF, MS, or XD standards, and Universal Serial Bus (USB) Flash drives (which can be referred to as USB Flash disks). The memory device 100 comprises a Flash memory 120, and further comprises a controller arranged to access the Flash memory 120, where the aforementioned controller of this embodiment is a memory controller 110. According to this embodiment, the memory controller 110 comprises a microprocessor 112, a read only memory (ROM) 112M, a control logic 114, a buffer memory 116, and an interface logic 118. In addition, the control logic 114 comprises an adjustment unit 114A, an encoder 114E, a seed generator 114G, and at least one randomizer/derandomizer 114R. In practice, the adjustment unit 114A can be an exclusive OR (XOR) gate or an adder. Please note that the portable memory device is taken as an example of the memory device 100 in this embodiment. This is for illustrative purposes only, and is not meant to be a limitation of the present invention. According to a variation of this embodiment, the memory device 100 can be a solid state drive (SSD).

In this embodiment, the ROM 112M is arranged to store a program code 112C, and the microprocessor 112 is arranged to execute the program code 112C to control the access to the Flash memory 120. Typically, the Flash memory 120 comprises a plurality of blocks, and the controller (e.g. the memory controller 110 that executes the program code 112C by utilizing the microprocessor 112) can perform data erasure operations on the Flash memory 120 by erasing in units of blocks. In addition, a block can be utilized for recording a specific amount of pages, where the controller mentioned above can perform data writing operations on the Flash memory 120 by writing/programming in units of pages.

In practice, the memory controller 110 that executes the program code 112C by utilizing the microprocessor 112 is capable of performing various control operations by utilizing the internal components within the memory controller 110. For example, the memory controller 110 utilizes the control logic 114 to control access to the Flash memory 120 (e.g. operations of accessing at least one block or at least one page), utilizes the buffer memory 116 to perform buffering operations for the memory controller 110, and utilizes the interface logic 118 to communicate with a host device. According to this embodiment, in addition to accessing the Flash memory 120, the memory controller 110 is capable of properly managing the plurality of blocks.

In addition, the memory controller 110 can further perform data shaping regarding data accessed by the memory controller 110 itself (e.g. the data D1 shown in FIG. 1A). More particularly, under control of the microprocessor 112, the memory controller 110 can perform data shaping by utilizing operations of the randomizer/derandomizer 114R to suppress errors regarding the data accessed by the memory controller 110 itself. More specifically, the seed generator 114G can generate an input seed S1 according to the data D1, and the randomizer/derandomizer 114R is arranged to generate a random function (i.e. shaping sequence) according to the input seed S1, with the random function being utilized for adjusting a plurality of bits of the data (e.g. the data D1) bit by bit when the controller receives a write/read command (e.g., more particularly, in a situation where the aforementioned write/read command represents a write command), where the write/read command is utilized for instructing the controller to write the data into/read the data from the Flash memory 120. As a result, the adjustment unit 114A shown in FIG. 1A adjusts the data D1 according to the random sequence 114RS (i.e. the sequence of the random function mentioned above) to generate the adjusted data $D_{RND1}$.

According to this embodiment, in a situation where the aforementioned write/read command represents the write command, when the data path passing through the adjustment unit 114A represents a write path, the data D1 may represent the data to be written into the Flash memory 120 by the controller, and the data $D_{RND1}$ may represent the adjusted data for being encoded by the encoder 114E. In addition, the encoder 114E performs encoding, and more particularly, performs Error Correction Code (ECC) encoding to generate encoded data, and writes the encoded data into the Flash memory 120, where the encoded data may comprise parity codes. This is for illustrative purposes only, and is not meant to be a limitation of the present invention. In a situation where the write/read command mentioned above represents a read command, when the data path passing through the adjustment unit 114A represents a read path, the read path can be coupled to a decoder 114D (not shown in FIG. 1A), where the decoder 114D performs decoding on encoded data read from the Flash memory 120, and more particularly, performs ECC decoding to generate decoded data such as the data $D_{RND1}$. In this situation, the input and output of the adjustment unit 114A shown in FIG. 1A are exchanged. That is, the adjustment unit 114A adjusts the data $D_{RND1}$ according to the random sequence 114RS to generate the adjusted data D1 for further processing. According to a special case of this embodiment, in a situation where the write/read command mentioned above represents the read command, the seed generator 114G can be utilized as a seed recoverer which is arranged to recover the input seed S1 according to the data $D_{RND1}$. According to another special case of this embodiment, the memory controller 110 comprises a seed recoverer 114Y (not shown in FIG. 1A) arranged to recover the input seed S1 according to the data $D_{RND1}$, and in a situation where the write/read command mentioned above represents the read command, the seed generator 114G can be replaced with the seed recoverer 114Y by utilizing path switching of switching circuits. According to a variation of this embodiment, at least one portion of the above operations can be implemented with one or more program modules within the program code 112C. Thus, at least one portion of the hardware required for the above operations can be replaced with the memory controller 110 that executes the one or more program modules by utilizing the microprocessor 112.

Figure 1B:
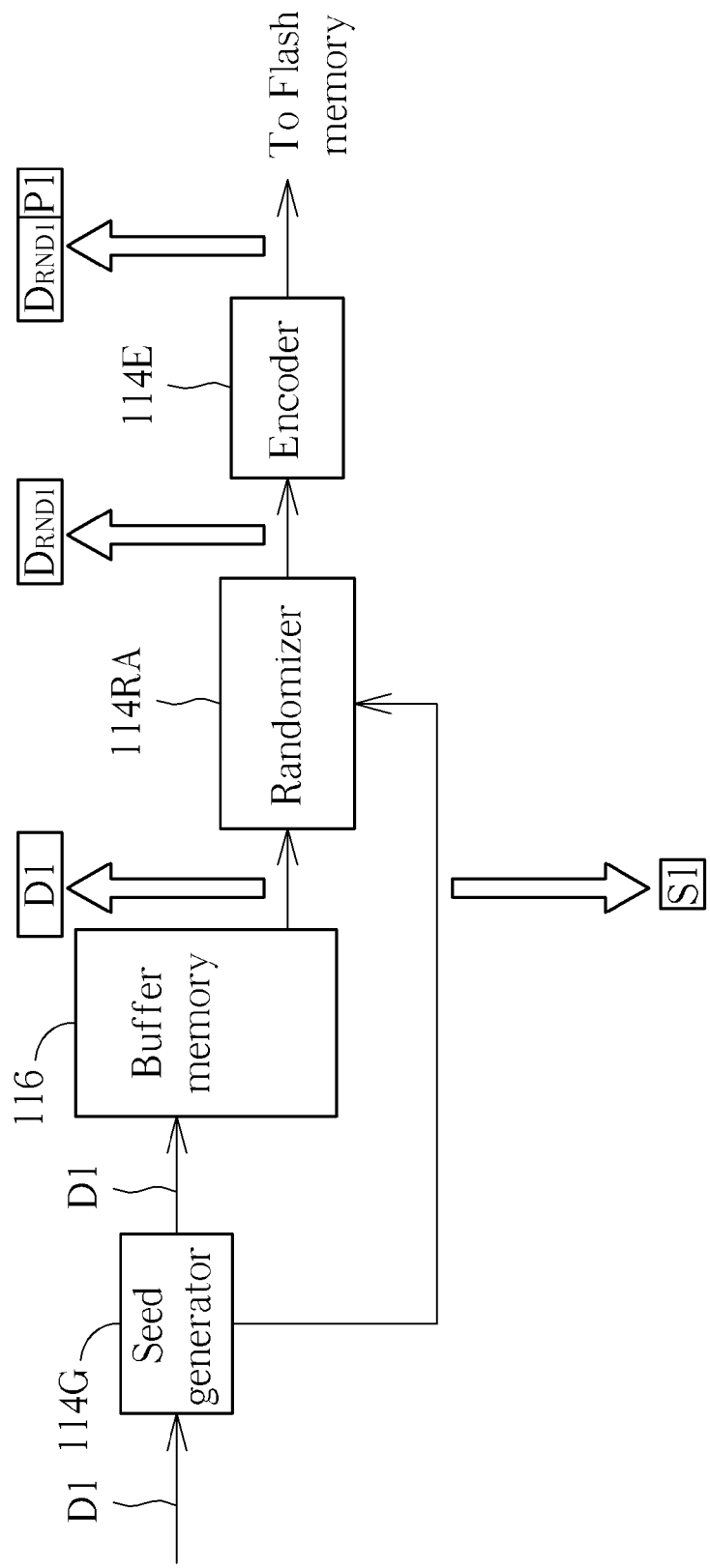
FIGS. 1B-1C illustrate some implementation details of the memory device shown in FIG. 1A according to an embodiment of the present invention.
Figure 1C:
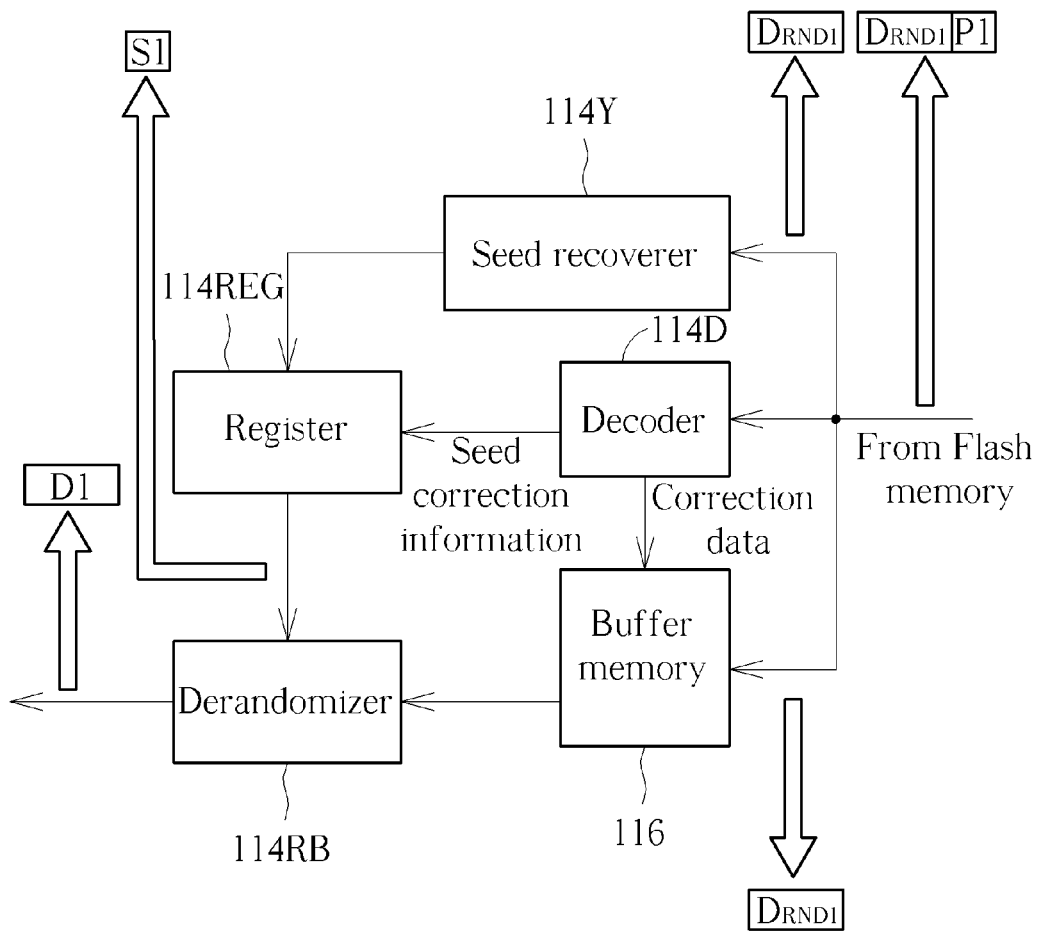

FIGS. 1B-1C illustrate some implementation details of the memory device 100 shown in FIG. 1A according to an embodiment of the present invention. For simplicity, the adjustment unit 114A mentioned above is integrated into the seed generator 114G shown in FIG. 1B and the seed recoverer 114Y shown in FIG. 1C, respectively. That is, each of the seed generator 114G and the seed recoverer 114Y of this embodiment comprises the adjustment unit 114A. According to a variation of this embodiment, the seed generator 114G and the seed recoverer 114Y can be the same component.

As shown in FIG. 1B, in a situation where the aforementioned write/read command represents the write command, the seed generator 114G receives the data D1 and generates the input seed S1 according to the data D1, and temporarily stores the data D1 into the buffer memory 116. In addition, the randomizer 114RA reads the data D1 from the buffer memory 116 and generates a random function such as the aforementioned random function according to the input seed S1, and adjusts a plurality of bits of the data D1 bit by bit according to a sequence of the random function to generate the data $D_{RND1}$. Additionally, the encoder 114E performs ECC encoding on the data $D_{RND1}$ to generate encoded data (which is illustrated as the data $D_{RND1}$ appended with the parity code P1 around the upper right corner in FIG. 1B), and writes the encoded data into the Flash memory 120.

As shown in FIG. 1C, in a situation where the write/read command mentioned above represents the read command, the encoded data that the memory controller 110 reads from the Flash memory 120 (which is illustrated as the data $D_{RND1}$ appended with the parity code P1 around the upper right corner in FIG. 1C) is sent to the decoder 114D, the seed recoverer 114Y, and the buffer memory 116, respectively. In an embodiment, under control of the memory controller 110, the seed recoverer 114Y only utilizes the data $D_{RND1}$ in the encoded data, rather than the parity code P1, and the buffer memory 116 only temporarily stores the data $D_{RND1}$, rather than the parity code P1. The seed recoverer 114Y receives the data $D_{RND1}$ and recovers an initial version of the input seed S1 according to the data $D_{RND1}$, and temporarily stores the initial version of the input seed S1 into the register 114REG. In addition, the decoder 114D performs decoding on the encoded data read from the Flash memory 120, and once any error is detected, the decoder 114D generates correction data to correct the data $D_{RND1}$ in the buffer memory 116, and further generates seed correction information to correct the input seed S1 in the register 114REG. In another embodiment, the decoder 114D can provide the seed recoverer 114Y with the seed correction information, so the seed recoverer 114Y retrieves the input seed S1 from the register 114REG and correct the input seed S1 according to the seed correction information, and then stores the corrected input seed S1 into the register 114REG. As a result, the derandomizer 114RB reads the corrected input seed S1 from the register 114REG and generates a random function such as the aforementioned random function according to the input seed S1, and reads the data $D_{RND1}$ from the buffer memory 116 and adjusts a plurality of bits of the data $D_{RND1}$ bit by bit according to a sequence of the random function to generate the data D1 for further processing.

According to a variation of the embodiment shown in FIG. 1C, the randomizer 114RA and the derandomizer 114RB can be the same component, and therefore, they can be collectively referred to as the randomizer/derandomizer 114R.

Figure 1D:
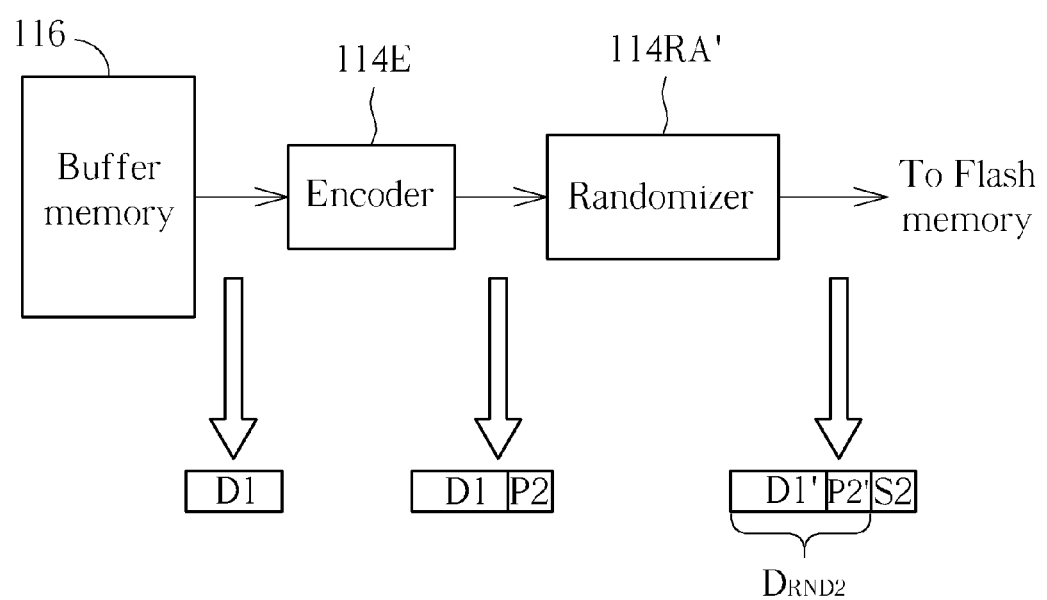
FIGS. 1D-1E illustrate some implementation details of the memory device shown in FIG. 1A according to another embodiment of the present invention.
Figure 1E:
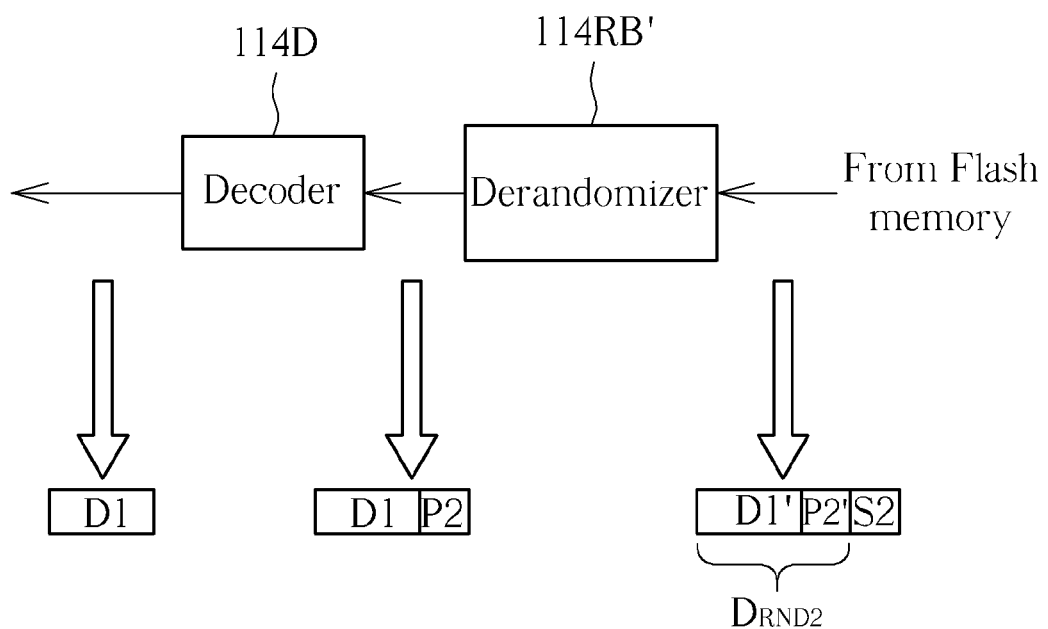

FIGS. 1D-1E illustrate some implementation details of the memory device 100 shown in FIG. 1A according to another embodiment of the present invention, where the randomizer 114RA and the derandomizer 114RB mentioned above are replaced with the randomizer 114RA' and the derandomizer 114RB', respectively.

As shown in FIG. 1D, in a situation where the aforementioned write/read command represents the write command, the encoder 114E reads the data D1 from the buffer memory 116 and performs ECC encoding on the data D1 to generate encoded data (which is illustrated as the data D1 appended with the parity code P2 in FIG. 1D), and outputs the encoded data to the randomizer 114RA'. In addition, the randomizer 114RA' generates a random function according to the input seed S2, and adjusts a plurality of bits of the encoded data bit by bit according to a sequence of the random function to generate the data $D_{RND2}$, and more particularly, adjusts a plurality of bits of both the data D1 and the parity code P2 bit by bit according to the sequence of the random function to generate the adjusted data D1' and the adjusted parity code P2', where the data $D_{RND2}$ comprises the adjusted data D1' and the adjusted parity code P2'. Additionally, the randomizer 114RA' writes the data $D_{RND2}$ (which is illustrated as the data D1' appended with the parity code P2' around the bottom right corner in FIG. 1D) and the input seed S2 appended to the data $D_{RND2}$ into the Flash memory 120.

As shown in FIG. 1E, in a situation where the write/read command mentioned above represents the read command, the data $D_{RND2}$ that the memory controller 110 reads from the Flash memory 120 (which is illustrated as the data D1' appended with the parity code P2' around the bottom right corner in FIG. 1E) and the input seed S2 are sent to the derandomizer 114RB'. In addition, the derandomizer 114RB' generates a random function according to the input seed S2, and adjusts a plurality of bits of the data $D_{RND2}$ bit by bit according to a sequence of the random function to generate the data D1 and the parity code P2 appended to the data D1, i.e. the encoded data generated by the encoder 114E shown in FIG. 1D. Additionally, the decoder 114D performs decoding on the encoded data received from the derandomizer 114RB' (which is illustrated as the data D1 appended with the parity code P2 in FIG. 1E) to generate the corrected data D1 for further processing.

According to a variation of this embodiment, the randomizer 114RA' and the derandomizer 114RB' can be the same component, and therefore, they can be collectively referred to as the randomizer/derandomizer 114R'.

Figure 1F:
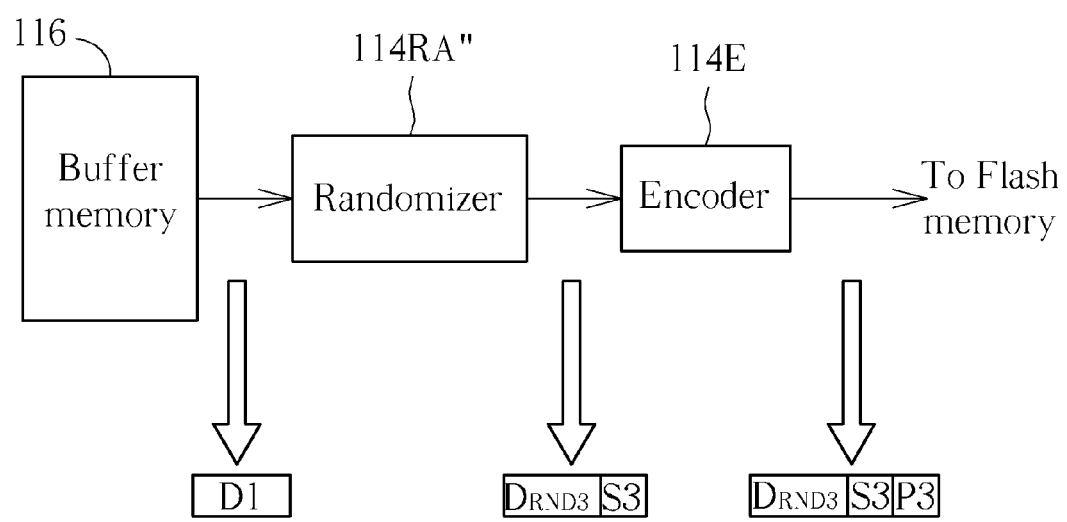
FIGS. 1F-1G illustrate some implementation details of the memory device shown in FIG. 1A according to another embodiment of the present invention.
Figure 1G:
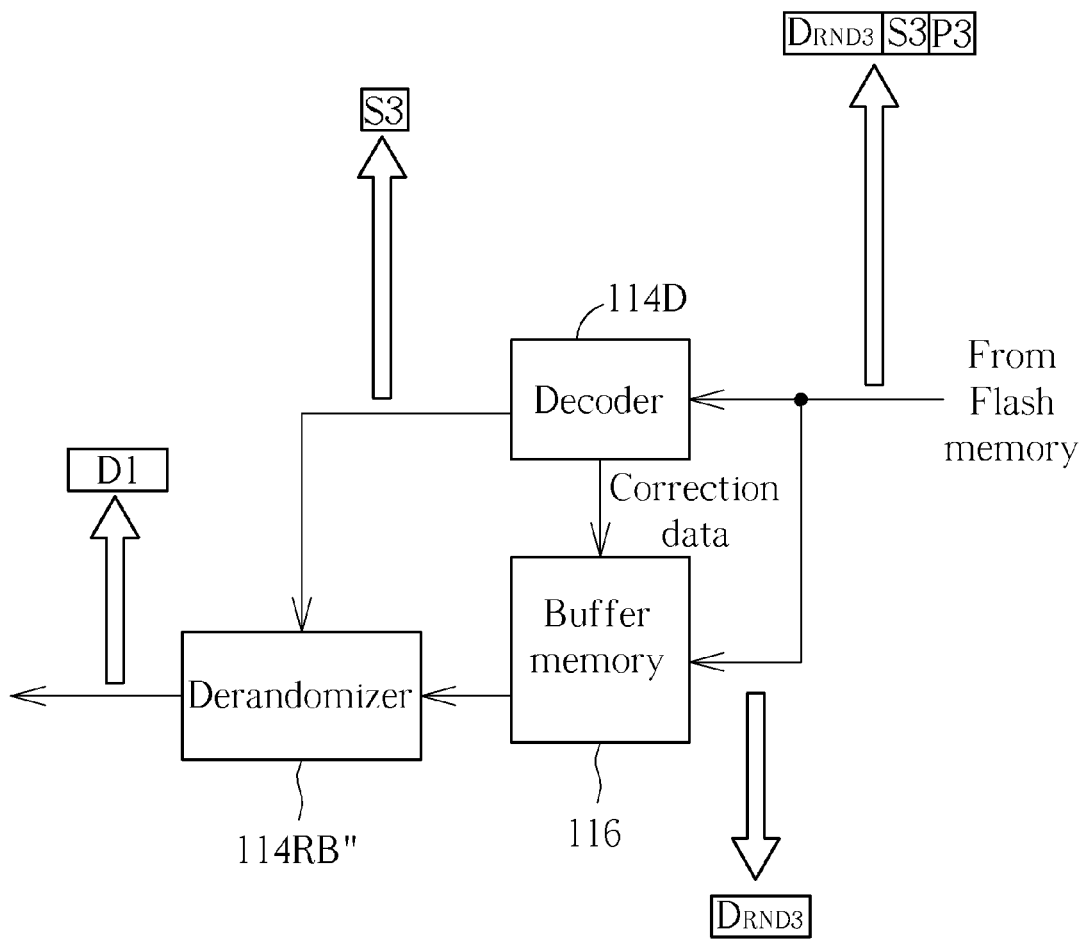

FIGS. 1F-1G illustrate some implementation details of the memory device 100 shown in FIG. 1A according to another embodiment of the present invention, where the randomizer 114RA and the derandomizer 114RB mentioned above are replaced with the randomizer 114RA" and the derandomizer 114RB", respectively.

As shown in FIG. 1F, in a situation where the aforementioned write/read command represents the write command, the randomizer 114RA" reads the data D1 from the buffer memory 116 and generates a random function according to the input seed S3, and adjusts a plurality of bits of the data D1 bit by bit according to a sequence of the random function to generate the data $D_{RND3}$. In addition, the randomizer 114RA" combines the data $D_{RND3}$ and the input seed S3 to generate combination data, and outputs the combination data to the encoder 114E. Additionally, the encoder 114E performs ECC encoding on the combination data to generate encoded data (which is illustrated as the data $D_{RND3}$ appended with the input seed S3 and the parity code P3 around the bottom right corner in FIG. 1F), and writes the encoded data to the Flash memory 120.

As shown in FIG. 1G, in a situation where the write/read command mentioned above represents the read command, the encoded data that the memory controller 110 reads from the Flash memory 120 (which is illustrated as the data $D_{RND3}$ appended with the input seed S3 and the parity code P3 around the upper right corner in FIG. 1G) is respectively sent to the decoder 114D and the buffer memory 116, where under control of the memory controller 110, the buffer memory 116 only temporarily stores the data $D_{RND3}$, rather than the input seed S3 and the parity code P3. The decoder 114D performs decoding on the encoded data read from the Flash memory 120, and once any error is detected, the decoder 114D generates correction data to correct the data $D_{RND3}$ in the buffer memory 116, and further generates seed correction information to correct the input seed S3 in the encoded data received by the decoder 114D. As a result, the derandomizer 114RB" generates a random function according to the input seed S3, and reads the data $D_{RND3}$ from the buffer memory 116 and adjusts a plurality of bits of the data $D_{RND3}$ bit by bit according to a sequence of the random function to generate the data D1 for further processing.

According to a variation of this embodiment, the randomizer 114RA" and the derandomizer 114RB" can be the same component, and therefore, they can be collectively referred to as the randomizer/derandomizer 114R".

Based upon the embodiment shown in FIGS. 1B-1C, the controller can generate/recover the input seed of at least one randomizer/derandomizer according to the contents of the data to be written into/read from the Flash memory 120, where it is unnecessary to merge any input seed into the data being written to the Flash memory 120. Therefore, when performing an internal data moving operation within the Flash memory 120, the present invention can guarantee the correctness of the input seed. This is for illustrative purposes only, and is not meant to be a limitation of the present invention. According to a variation of this embodiment, the controller may have multiple operation modes such as a first mode, a second mode, and a third mode, where the operation method of the first mode can be the same as that of the embodiment shown in FIGS. 1B-1C, the operation method of the second mode can be the same as that of the embodiment shown in FIGS. 1D-1E, and the operation method of the third mode can be the same as that of the embodiment shown in FIGS. 1F-1G. Please refer to FIG. 2 for related details of data shaping performed by the memory controller 110.

Figure 2:
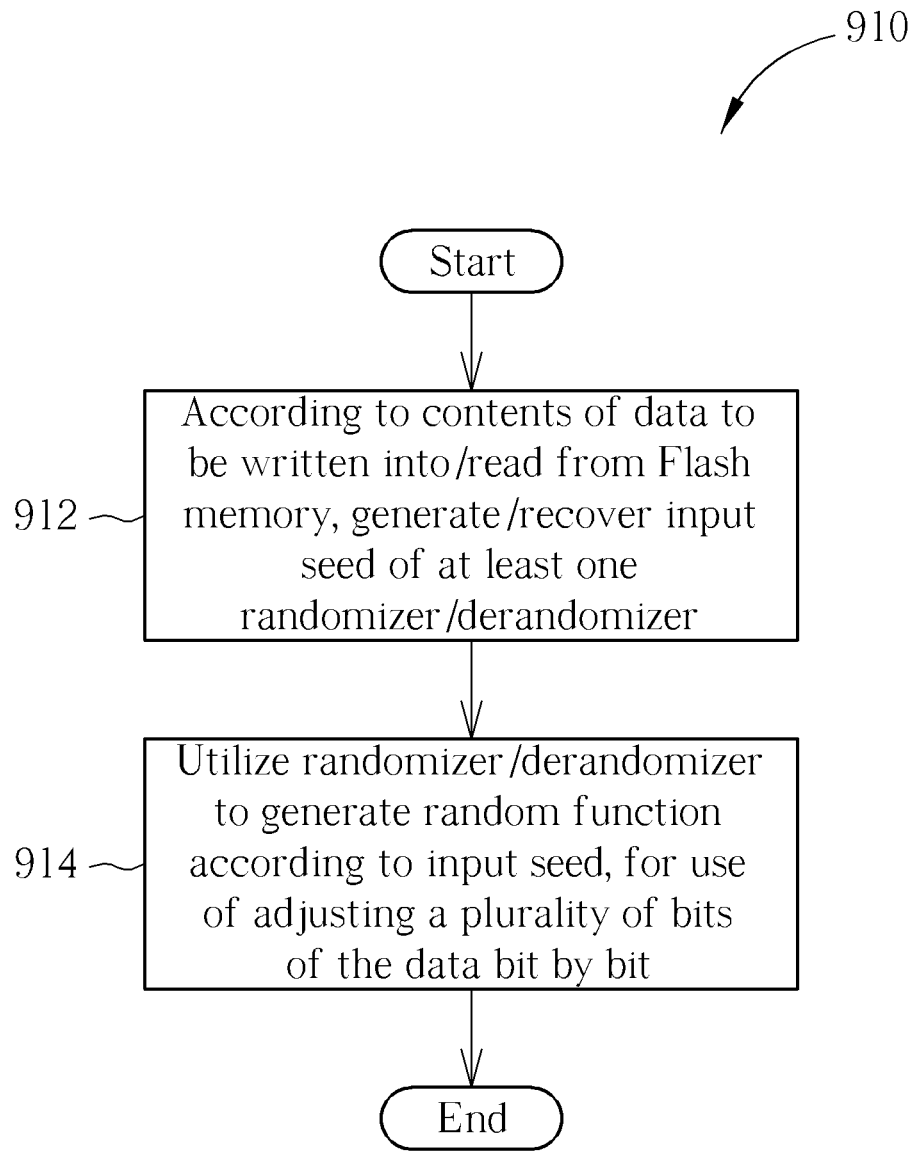
FIG. 2 is a flowchart of a method for performing data shaping according to one embodiment of the present invention.

FIG. 2 is a flowchart of a method 910 for performing data shaping according to an embodiment of the present invention. The method can be applied to the memory device 100 shown in FIG. 1A, and more particularly, to the controller mentioned above (e.g. the memory controller 110 that executes the program code 112C by utilizing the microprocessor 112). In addition, the method can be implemented by utilizing the memory device 100 shown in FIG. 1A, and more particularly, by utilizing the controller mentioned above. The method 910 is described as follows.

In Step 912, according to contents of data to be written into/read from the Flash memory 120 (e.g. the data D1), the controller generates/recovers an input seed of at least one randomizer/derandomizer such as the randomizer/derandomizer 114R (e.g. the randomizer 114RA and/or the derandomizer 114RB), such as the input seed S1 mentioned above. More particularly, the controller utilizes at least one seed generator/seed recoverer (e.g. the seed generator 114G and/or the seed recoverer 114Y) to generate/recover the input seed according to the contents of the data.

In Step 914, the controller utilizes the randomizer/derandomizer such as the randomizer/derandomizer 114R to generate a random function such as the random function mentioned above according to the input seed, for use of adjusting a plurality of bits of the data bit by bit. For example, this operation can be implemented by performing an exclusive OR (XOR) operation on the data and a sequence of the random function, and more particularly, by performing the XOR operation on corresponding bits of both the data and the sequence of the random function, where such an XOR operation can be referred to as the bitwise XOR operation.

According to this embodiment, the data comprises a plurality of portions, and the seed generator/seed recoverer respectively performs an XOR operation on corresponding bits of at least two portions of the plurality of portions to generate/recover the input seed S1. That is, the operation of the seed generator/seed recoverer comprises at least one bitwise XOR operation (e.g. one or more bitwise XOR operations). More particularly, for simplifying the operations, the number of the plurality of portions can be an even number. For example, in a situation where the data D1 includes 8 bytes, the values of the first two bits of the first byte within the data D1 are both equal to 1, and the values of the other bits within the data D1 are all equal to 0. Thus, the data D1 can be written as {11000000, 00000000, 00000000, 00000000, 00000000, 00000000, 00000000, 00000000}. First, the seed generator 114G can perform an XOR operation on corresponding bits of the first two bytes to generate an XOR operation result 11000000, and then perform an XOR operation on corresponding bits of this operation result 11000000 and the third byte 00000000 to generate an XOR operation result 11000000, and then perform an XOR operation on corresponding bits of the latest operation result 11000000 and the fourth byte 00000000 to generate an XOR operation result 11000000, and so on. When the last byte 00000000 is obtained and utilized for performing a bitwise XOR operation, the seed generator 114G generates the latest operation result 11000000 as the input seed S1. Please note that, according to this embodiment, no matter whether the seed generator 114G and the seed recoverer 114Y are the same component, the implementation of the method 910 will not be hindered. In addition, regarding data whose bits are all zero, the controller can perform exception processing and/or perform reversible modification on the data in advance. Thus, smoothness of the overall operation can be guaranteed.

In this embodiment, the sequence of the random function that the randomizer/derandomizer 114R generates regarding the input seed S1 comprises at least one pair of sub-sequences, wherein each pair of sub-sequences, a sub-sequence is equivalent to another sub-sequence. For example, the sequence of the random function that the randomizer/derandomizer 114R generates regarding the input seed $S1(X_1)$, such as the sequence {11110000, 11001100, 10101010, 00110011, 11110000, 11001100, 10101010, 00110011}, includes a pair of sub-sequences {11110000, 11001100, 10101010, 00110011} and {11110000, 11001100, 10101010, 00110011}, where these two sub-sequences are equivalent to each other. For better comprehension, the sequence of the random function can also be written as {{11110000, 11001100, 10101010, 00110011}, {11110000, 11001100, 10101010, 00110011}}. In another example, the sequence of the random function that the randomizer/derandomizer 114R generates regarding the input seed S1($X_2$), such as the sequence {11110000, 11001100, 11110000, 11001100, 10101010, 00110011, 10101010, 00110011}, includes a plurality of pairs of sub-sequences, such as a pair of sub-sequences {11110000, 11001100} and {11110000, 11001100} and another pair of sub-sequences {10101010, 00110011} and {10101010, 00110011}. For better comprehension, the sequence of the random function can also be written as {{{11110000, 11001100}, {11110000, 11001100}}, {{10101010, 00110011}, {10101010, 00110011}}}. In these examples, the sub-sequences of the same pair are adjacent to each other. This is for illustrative purposes only, and is not meant to be a limitation of the present invention. In some other examples, it is unnecessary that the sub-sequences of the same pair are adjacent to each other. For example, the sequence of the random function that the randomizer/derandomizer 114R generates regarding the input seed S1($X_3$), such as the sequence {11110000, 11001100, 10101010, 00110011, 10101010, 00110011, 11110000, 11001100}, also includes a plurality of pairs of sub-sequences, where a pair of sub-sequences comprise the first two bytes {11110000, 11001100} and the last two bytes {11110000, 11001100}, and another pair of sub-sequences comprise the two bytes {10101010, 00110011} that start from the third byte and the two bytes {10101010, 00110011} that start from the fifth byte.

For simplifying the operations, in a situation where the sequence of the random function comprises a plurality of pairs of sub-sequences, the length of any sub-sequence in any pair of sub-sequences within the plurality of pairs of sub-sequences is equal to the length of any sub-sequence in another pair of sub-sequences within the plurality of pairs of sub-sequences. This is for illustrative purposes only, and is not meant to be a limitation of the present invention. According to a variation of this embodiment, the length of any sub-sequence in a first pair of sub-sequences within the plurality of pairs of sub-sequences is different from the length of any sub-sequence in a second pair of sub-sequences within the plurality of pairs of sub-sequences.

In addition, for simplifying the operations, the length of each sub-sequence is equivalent to the length of one or more bytes. This is for illustrative purposes only, and is not meant to be a limitation of the present invention. According to a variation of this embodiment, in a situation where the sequence of the random function comprises a plurality of pairs of sub-sequences, in a pair of sub-sequences within the plurality of pairs of sub-sequences, the length of each sub-sequence is not equivalent to the length of one or more bytes. For example, in the sequence of the random function that the randomizer/derandomizer 114R generates regarding the input seed S1($X_4$), such as the sequence {11110000, 11001100, 10101111 00001100, 11001010, 10100011, 00111010, 00110011}, the length of each sub-sequences in a pair of sub-sequences {11110000, 11001100, 1010} and {11110000, 11001100, 1010} is equivalent to the length of twenty bits, and the length of each sub-sequences in another pair of sub-sequences {1010, 00110011} and {1010, 00110011} is equivalent to the length of twelve bits. For better comprehension, the sequence of the random function can also be written as {{{11110000, 11001100, 1010}, {11110000, 11001100, 1010}}, {{1010, 00110011}, {1010, 00110011}}}.

Please note that, during the operation that the controller adjusts a plurality of bits of the data bit by bit, the randomizer/derandomizer 114R (e.g. the randomizer 114RA and/or the derandomizer 114RB) adjusts the plurality of bits of the data bit by bit according to a sequence of the random function. In practice, this operation can be implemented by performing a bitwise XOR operation on the data and the sequence of the random function. In this situation, as the sub-sequences in the sequence of the random function are intentionally designed to be in pairs, during the operation that the seed generator/seed recoverer (e.g. the seed generator 114G and/or the seed recoverer 114Y) generates/recovers the input seed S1, the effects that the sub-sequences of the same pair respectively apply to the data $D_{RND1}$ will cancel with each other.

For example, the adjustment unit 114A shown in FIG. 1A adjusts the data D1 according to the random sequence 114RS (i.e. the sequence of the random function mentioned above) to generate the adjusted data $D_{RND1}$. Referring to this embodiment and the embodiment shown in FIGS. 1B-1C, it will be appreciated that, in a situation where the sub-sequences in the sequence of the random function are designed to be in pairs, the input seed that the seed recoverer 114Y recovers according to the data $D_{RND1}$ is exactly the input seed 51 that the seed generator 114G generates according to the data D1 (e.g. any of the input seeds S1($X_1$), S1($X_2$), S1($X_3$), and S1($X_4$)).

Figure 3A:
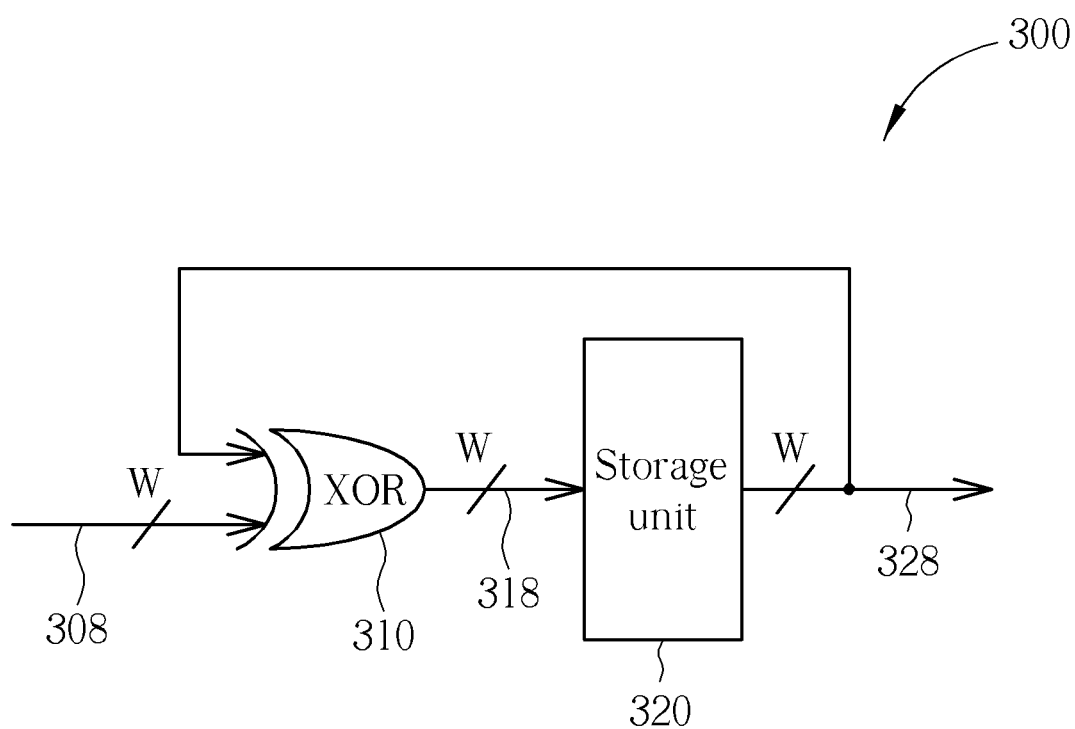
FIGS. 3A-3B illustrate some implementation details of the seed generator shown in FIG. 1B and the seed recoverer shown in FIG. 1C that are involved with the method shown in FIG. 2 according to an embodiment of the present invention.
Figure 3B:
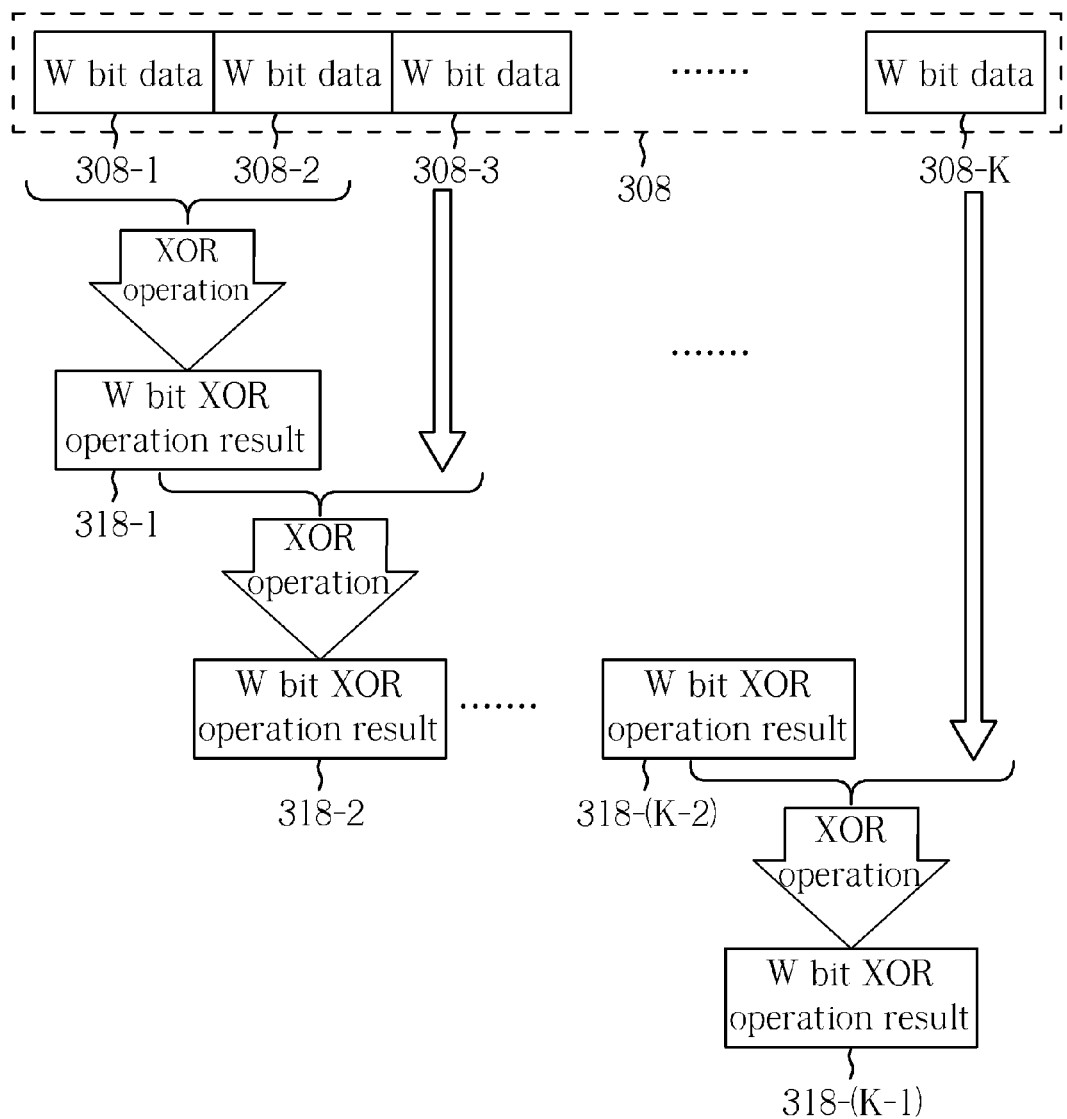

FIGS. 3A-3B illustrate some implementation details of the seed generator 114G shown in FIG. 1B and the seed recoverer 114Y shown in FIG. 1C that are involved with the method shown in FIG. 2 according to an embodiment of the present invention, where the numeral 300 can be utilized for respectively representing the seed generator 114G and the seed recoverer 114Y, and no matter whether the seed generator 114G and the seed recoverer 114Y are implemented as the same component, the operations of this embodiment will not be hindered.

As shown in FIG. 3A, the seed generator/seed recoverer 300 comprises W XOR gates 310 and a storage unit 320, where the notation W represents the number of bits of the data involved with the XOR operations of the XOR gates 310, and W of this embodiment may represent a positive integer that is greater than one. The input data 308 is input into the XOR gates 310 in units of W bits, and the storage unit 320 can temporarily store W bit XOR operation results (respectively labeled "W bit XOR operation result" in FIG. 3B, i.e. the XOR operation result including W bits) of the XOR gates 310. As the controller can reset an initial value of the storage unit 320 to be zero, when the W bit data 308-1 within the data 308 is input into the XOR gates 310, the output data 318 thereof is equivalent the W bit data 308-1, so the storage unit 320 temporarily stores the W bit data 308-1.

Afterward, as shown in FIG. 3B, the seed generator/seed recoverer 300 performs a bitwise XOR operation (labeled "XOR operation" in FIG. 3B) on the W bit data 308-1 and the W bit data 308-2 to generate the W bit XOR operation result 318-1, and then performs a bitwise XOR operation on the W bit XOR operation result 318-1 and the W bit data 308-3 to generate the W bit XOR operation result 318-2, and then performs a bitwise XOR operation on the W bit XOR operation result 318-2 and the W bit data 308-4 to generate the W bit XOR operation result 318-3, and so on. As a result, the seed generator/seed recoverer 300 performs a bitwise XOR operation on the W bit XOR operation result 318-(K−2) and the W bit data 308-K to generate the W bit XOR operation result 318-(K−1) and utilizes the W bit XOR operation result 318-(K−1) as the output data 328, where the output data 328 includes W bits. Please note that the output data 328 represents the input seed S1 mentioned above. In practice, for simplifying the operations, W can be 8 or a multiple of 8.

According to some variations of this embodiment, the order of the XOR operations shown in FIG. 3B can be varied. That is, the order of inputting the W bit data 308-1, 308-2, ..., and 308-K shown in FIG. 3B into the XOR gates 310 can be varied.

According to some variations of this embodiment, the W bit data 308-1, 308-2, ..., and 308-K can be divided into $N_P(11)$ portions, and each portion comprises at least two of the W bit data 308-1, 308-2, ..., and 308-K. The seed generator/seed recoverer 300 can respectively perform bitwise XOR operations on the $N_P(11)$ portions to generate $N_P(11)$ corresponding W bit XOR operation results, where regarding each portion, the number of bitwise XOR operations is equal to the number of "W bit data" within the portion under consideration (such as some of the W bit data 308-1, 308-2, ..., and 308-K shown in FIG. 3B) minus one. Then, the seed generator/seed recoverer 300 performs bitwise XOR operations on the $N_P(11)$ W bit XOR operation results to generate the final W bit XOR operation result. More particularly, According to at least one of these variations, a plurality of copies of the seed generator/seed recoverer 300 can be implemented, for use of performing bitwise XOR operations in a parallel manner.

According to some variations of this embodiment, the W bit data 308-1, 308-2, ..., and 308-K can be divided into $N_P(22)$ portions, where each portion of $N_P(21)$ portions within the $N_P(22)$ portions comprises at least two of the W bit data 308-1, 308-2, ..., and 308-K, and each portion of the remaining portions within the $N_P(22)$ portions comprises one of the W bit data 308-1, 308-2, ..., and 308-K. The seed generator/seed recoverer 300 can respectively perform bitwise XOR operations on the $N_P(21)$ portions to generate $N_P(21)$ corresponding W bit XOR operation results, where regarding each portion, the number of bitwise XOR operations is equal to the number of "W bit data" within the portion under consideration (such as some of the W bit data 308-1, 308-2, ..., and 308-K shown in FIG. 3B) minus one. Then, the seed generator/seed recoverer 300 performs bitwise XOR operations on the $N_P(21)$ W bit XOR operation results and the W bit data of the aforementioned remaining portions to generate the final W bit XOR operation result.

Figure 4A:
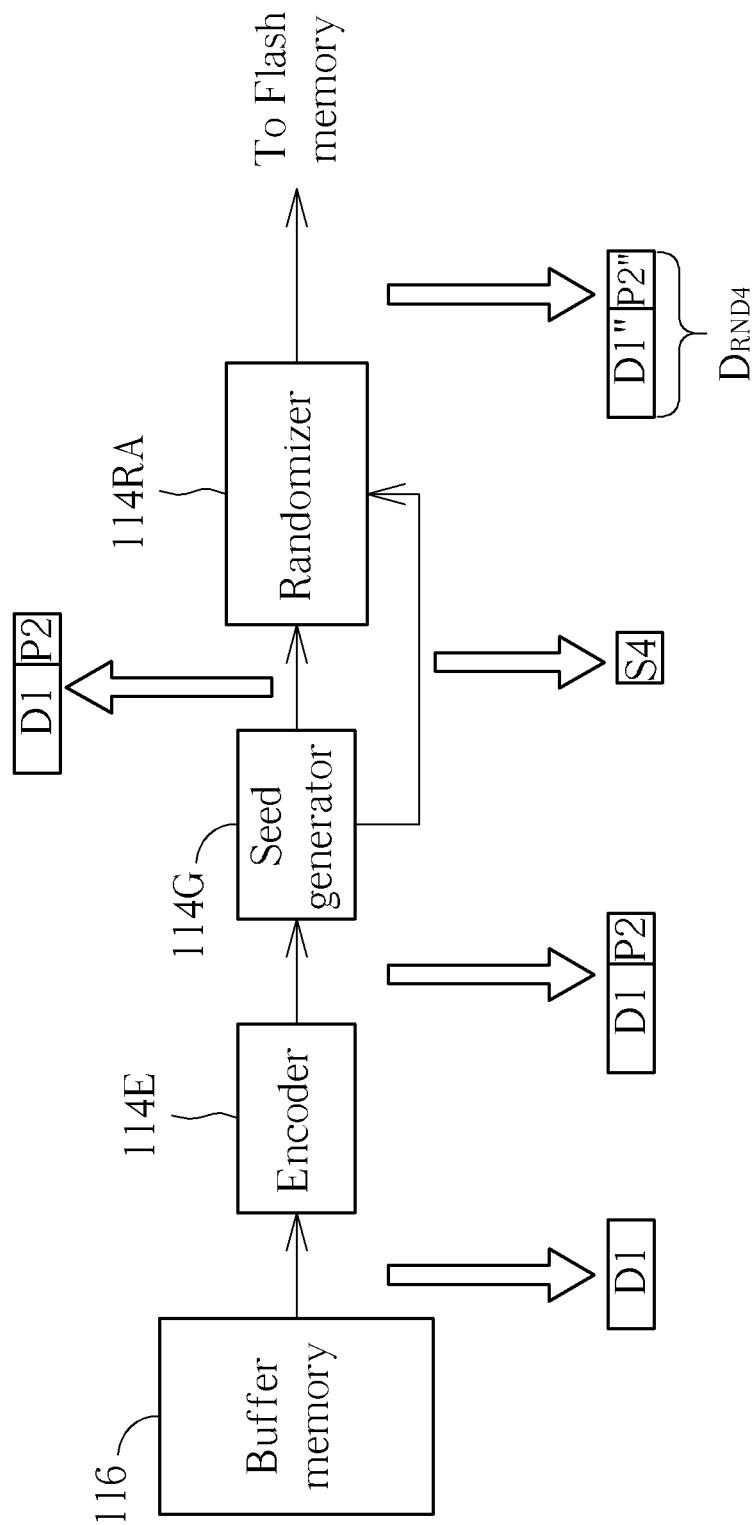
FIGS. 4A-4B illustrate some implementation details of the memory device shown in FIG. 1A according to another embodiment of the present invention.
Figure 4B:
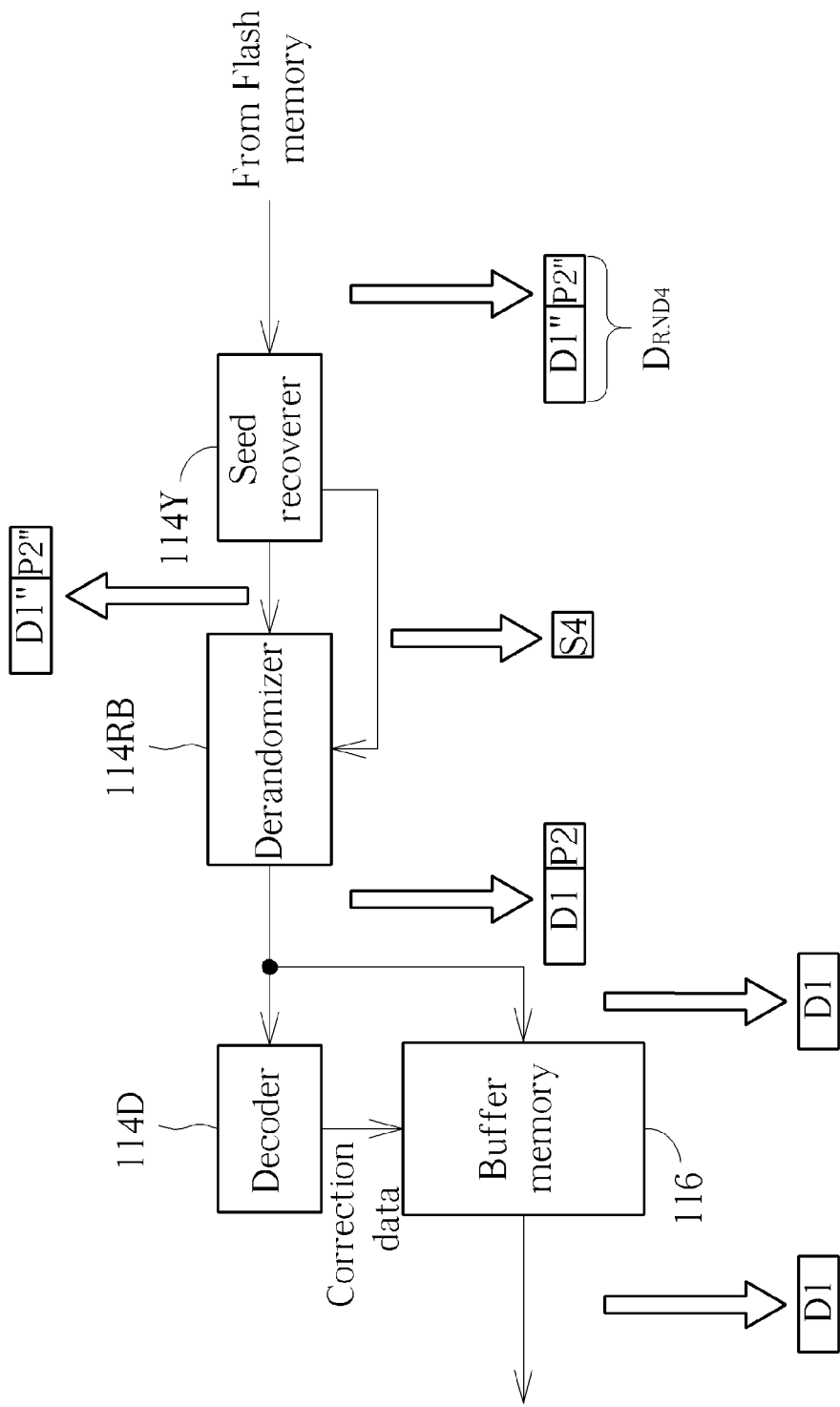

FIGS. 4A-4B illustrate some implementation details of the memory device 100 shown in FIG. 1A according to another embodiment of the present invention, where the order of some operations of this embodiment is different from the order of the corresponding operations of the embodiment shown in FIG. 1A. For simplicity, the adjustment unit 114A mentioned above is integrated into the seed generator 114G shown in FIG. 4A and the seed recoverer 114Y shown in FIG. 4B, respectively. That is, each of the seed generator 114G and the seed recoverer 114Y of this embodiment comprises the adjustment unit 114A. According to a variation of this embodiment, the seed generator 114G and the seed recoverer 114Y can be the same component.

As shown in FIG. 4A, in a situation where the aforementioned write/read command represents the write command, the encoder 114E reads the data D1 from the buffer memory 116 and performs ECC encoding on the data D1 to generate encoded data (which is illustrated as the data D1 appended with the parity code P2 in FIG. 4A), and outputs the encoded data to the seed generator 114G and outputs the encoded data to the randomizer 114RA through the seed generator 114G, where the seed generator 114G generates the input seed S4 according to the encoded data. In addition, the randomizer 114RA generates a random function according to the input seed S4, and adjusts a plurality of bits of the encoded data bit by bit according to a sequence of the random function to generate the data $D_{RND4}$, and more particularly, adjusts a plurality of bits of both the data D1 and the parity code P2 bit by bit according to the sequence of the random function to generate the adjusted data D1" and the adjusted parity code P2", where the data $D_{RND4}$ comprises the adjusted data D1" and the adjusted parity code P2". Additionally, the randomizer 114RA writes the data $D_{RND4}$ (which is illustrated as the data D1" appended with the parity code P2" around the bottom right corner in FIG. 4A) into the Flash memory 120.

As shown in FIG. 4B, in a situation where the write/read command mentioned above represents the read command, the data $D_{RND4}$ that the memory controller 110 reads from the Flash memory 120 (which is illustrated as the data D1" appended with the parity code P2" around the bottom right corner in FIG. 4B) is sent to the seed recoverer 114Y, and is sent to the derandomizer 114RB through the seed recoverer 114Y, where the seed recoverer 114Y recovers the input seed S4 according to the data $D_{RND4}$. In addition, the derandomizer 114RB generates a random function according to the input seed S4, and adjusts a plurality of bits of the data $D_{RND4}$ bit by bit according to a sequence of the random function to generate the data D1 and the parity code P2 appended to the data D1, i.e. the encoded data generated by the encoder 114E shown in FIG. 4A, where the buffer memory 116 temporarily stores the data D1. Additionally, the decoder 114D performs decoding on the encoded data received from the derandomizer 114RB (which is illustrated as the data D1 appended with the parity code P2 in FIG. 4B), and once any error is detected, the decoder 114D generates correction data to correct the data D1 in the buffer memory 116, so the data D1 can be utilized for further processing.

According to a variation of this embodiment, the randomizer 114RA and the derandomizer 114RB can be the same component, and therefore, they can be collectively referred to as the randomizer/derandomizer 114R.

It is an advantage of the present invention that, by properly designing the sequence of the random function and the seed generator/seed recoverer accompanied with associated data flow control (e.g. the data flow control disclosed in FIGS. 1A-1G), the present invention can properly perform data pattern management regarding data accessed by the controller, in order to reduce the probability of error occurrence. In addition, implementing according to any of the respective embodiments/variations disclosed above will not cause unreasonable additional costs, and even can save costs in contrast to the related art. Therefore, by implementing based upon one or more of the embodiments/variations disclosed above, the related art problems can be resolved without greatly increasing the overall costs.

Those skilled in the art will readily observe that numerous modifications and alterations of the device and method may be made while retaining the teachings of the invention.

What is claimed is:

1. A method for writing data into a Flash memory, the method being applied to a controller of the Flash memory, the Flash memory comprising a plurality of blocks, the method comprising:

according to contents of the data to be written into the Flash memory, utilizing at least one seed generator to generate an input seed of at least one randomizer; utilizing the randomizer to generate a random function according to the input seed, using the random function to perform data shaping upon the data by adjusting a plurality of bits of the data to generate shaped data;

writing the shaped data into the Flash memory;

wherein the data comprises a plurality of portions; and the seed generator performs an exclusive OR (XOR) operation on corresponding bits of at least two portions of the plurality of portions to generate the input seed.

2. The method of claim 1, wherein a number of the plurality of portions is an even number.

3. A method for writing data into a Flash memory, the method being applied to a controller of the Flash memory, the Flash memory comprising a plurality of blocks, the method comprising:

according to contents of the data to be written into the Flash memory, generating an input seed of at least one randomizer; utilizing the randomizer to generate a random function according to the input seed, using the random function to perform data shaping upon the data by adjusting a plurality of bits of the data to generate shaped data;

writing the shaped data into the Flash memory;

wherein a sequence of the random function that the randomizer generates regarding the input seed comprises at least one pair of sub-sequences;

and in each pair of sub-sequences, a sub-sequence is equivalent to another sub-sequence.

4. The method of claim 3, wherein the sequence of the random function that the randomizer generates regarding the input seed comprises a plurality of pairs of sub-sequences; and a length of any sub-sequence in a first pair of sub-sequences within the plurality of pairs of sub-sequences is different from a length of any sub-sequence in a second pair of sub-sequences within the plurality of pairs of sub-sequences.

5. The method of claim 3, wherein the sequence of the random function that the randomizer generates regarding the input seed comprises a plurality of pairs of sub-sequences; and in a pair of sub-sequences within the plurality of pairs of sub-sequences, a length of each sub-sequence is not equivalent to a length of an integral multiple of a byte.

6. A memory device, comprising:

a Flash memory comprising a plurality of blocks; and a controller arranged to access the Flash memory and manage the plurality of blocks, and further perform data shaping regarding data accessed by the controller itself, wherein the controller comprises:

at least one randomizer arranged to generate a random function according to an input seed, with the random function being utilized for adjusting a plurality of bits of the data when the controller receives a write command, wherein the write command is utilized for instructing the controller to write the data into the Flash memory;

wherein the controller further comprises at least one seed generator, and according to contents of the data to be written into the Flash memory, the seed generator generates the input seed and performs data shaping upon the data by adjusting the plurality of bits of the data to generate shaped data to be written into the Flash memory;

wherein the data comprises a plurality of portions; and the seed generator performs an exclusive OR (XOR) operation on corresponding bits of at least two portions of the plurality of portions to generate the input seed.

7. The memory device of claim 6, wherein a number of the plurality of portions is an even number.

8. A memory device, comprising:

a Flash memory comprising a plurality of blocks; and a controller arranged to access the Flash memory and manage the plurality of blocks, and further perform data shaping regarding data accessed by the controller itself, wherein the controller comprises:

at least one randomizer arranged to generate a random function according to an input seed, with the random function being utilized for adjusting a plurality of bits of the data when the controller receives a write command, wherein the write command is utilized for instructing the controller to write the data into the Flash memory;

wherein according to contents of the data to be written into the Flash memory, the controller generates the input seed and performs data shaping upon the data by adjusting the plurality of bits of the data to generate shaped data to be written into the Flash memory;

wherein a sequence of the random function that the randomizer generates regarding the input seed comprises at least one pair of sub-sequences; and in each pair of sub-sequences, a sub-sequence is equivalent to another sub-sequence.

9. The memory device of claim 8, wherein the sequence of the random function that the randomizer generates regarding the input seed comprises a plurality of pairs of sub-sequences; and a length of any sub-sequence in a first pair of sub-sequences within the plurality of pairs of sub-sequences is different from a length of any sub-sequence in a second pair of sub-sequences within the plurality of pairs of sub-sequences.

10. The memory device of claim 8, wherein the sequence of the random function that the randomizer generates regarding the input seed comprises a plurality of pairs of sub-sequences; and in a pair of sub-sequences within the plurality of pairs of sub-sequences, a length of each sub-sequence is not equivalent to a length of an integral multiple of a byte.

11. A controller of a memory device, the controller being utilized for accessing a Flash memory comprising a plurality of blocks, the controller comprising:

a read only memory (ROM) arranged to store a program code;

a microprocessor arranged to execute the program code to control access to the Flash memory and manage the plurality of blocks, wherein under control of the microprocessor, the controller performs data shaping regarding data accessed by the controller itself; and at least one randomizer arranged to generate a random function according to an input seed, with the random function being utilized for adjusting a plurality of bits of the data when the controller receives a write command, wherein the write command is utilized for instructing the controller to write the data into the Flash memory;

wherein the controller further comprises at least one seed generator, and according to contents of the data to be written into the Flash memory, the seed generator generates the input seed and performs data shaping upon the data by adjusting the plurality of bits of the data to generate shaped data to be written into the Flash memory;

wherein the data comprises a plurality of portions; and the seed generator performs an exclusive OR (XOR) operation on corresponding bits of at least two portions of the plurality of portions to generate the input seed.

12. The controller of claim 11, wherein a number of the plurality of portions is an even number.

13. A controller of a memory device, the controller being utilized for accessing a Flash memory comprising a plurality of blocks, the controller comprising:
- a read only memory (ROM) arranged to store a program code;
- a microprocessor arranged to execute the program code to control access to the Flash memory and manage the plurality of blocks, wherein under control of the microprocessor, the controller performs data shaping regarding data accessed by the controller itself; and
- at least one randomizer arranged to generate a random function according to an input seed, with the random function being utilized for adjusting a plurality of bits of the data when the controller receives a write command, wherein the write command is utilized for instructing the controller to write the data into the Flash memory;
- wherein according to contents of the data to be written into the Flash memory, the controller generates the input seed and performs data shaping upon the data by adjusting the plurality of bits of the data to generate shaped data to be written into the Flash memory;
- wherein a sequence of the random function that the randomizer generates regarding the input seed comprises at least one pair of sub-sequences; and in each pair of sub-sequences, a sub-sequence is equivalent to another sub-sequence.

* * * * *